(12) United States Patent
Dorrough

(10) Patent No.: US 8,476,912 B2
(45) Date of Patent: *Jul. 2, 2013

(54) OBSCURED FEATURE DETECTOR AND METHOD

(75) Inventor: David Dorrough, Eagle, ID (US)

(73) Assignee: Franklin Sensors, Inc., Eagle, ID (US)

( * ) Notice: Subject to any disclaimer, the term of this patent is extended or adjusted under 35 U.S.C. 154(b) by 357 days.

This patent is subject to a terminal disclaimer.

(21) Appl. No.: 12/826,478

(22) Filed: Jun. 29, 2010

(65) Prior Publication Data

US 2011/0215822 A1    Sep. 8, 2011

Related U.S. Application Data

(60) Provisional application No. 61/339,316, filed on Mar. 4, 2010, provisional application No. 61/333,252, filed on May 10, 2010, provisional application No. 61/345,591, filed on May 17, 2010.

(51) Int. Cl.
    *G01R 27/26* (2006.01)
(52) U.S. Cl.
    USPC ............................ 324/687; 324/671; 324/690
(58) Field of Classification Search
    None
    See application file for complete search history.

(56) References Cited

U.S. PATENT DOCUMENTS

| | | | |
|---|---|---|---|
| 4,099,118 A | 7/1978 | Franklin et al. | |
| 4,464,622 A * | 8/1984 | Franklin | ......................... 324/67 |
| 4,992,741 A * | 2/1991 | Douglas et al. | ............... 324/671 |
| 5,214,388 A | 5/1993 | Vranish et al. | |
| 5,325,442 A | 6/1994 | Knapp | |
| 5,352,974 A | 10/1994 | Heger | |
| 5,619,128 A | 4/1997 | Heger | |
| 5,682,032 A | 10/1997 | Philipp | |
| 5,730,165 A | 3/1998 | Philipp | |
| 5,773,971 A | 6/1998 | Tavernetti | |
| 5,844,486 A | 12/1998 | Kithil et al. | |
| 5,917,314 A | 6/1999 | Heger et al. | |
| 6,023,159 A | 2/2000 | Heger | |
| 6,152,514 A | 11/2000 | McLellen | |
| 6,198,271 B1 | 3/2001 | Heger et al. | |
| 6,211,662 B1 | 4/2001 | Bijawat et al. | |
| 6,215,293 B1 | 4/2001 | Yim | |
| 6,249,113 B1 | 6/2001 | Krantz et al. | |
| 6,259,241 B1 | 7/2001 | Krantz | |
| 6,288,707 B1 | 9/2001 | Philipp | |
| 6,370,965 B1 | 4/2002 | Knapp | |

(Continued)

FOREIGN PATENT DOCUMENTS

EP    1622266 A1    2/2006

*Primary Examiner* — Vinh Nguyen

(74) *Attorney, Agent, or Firm* — Parsons Behle & Latimer

(57) ABSTRACT

An obscured feature detector operates from a stationary position on a surface being examined. The detector includes a plurality of sensor plates positioned in an array on the underside of the device, which sense the examined surface. The sensor plates are connected to a capacitance sensing circuit, which connects to indicators positioned on the back side of the detector through additional circuitry. A handle positioned on the back of the detector allows the user to grasp the device and place it in a stationary position on the surface being examined while also observing the indicators on the back side of the detector. Increases in capacitance caused by the presence of features behind or within the surface being examined are detected by the sensor plates and the capacitance sensing circuit. The indicators identify locations of larger capacitances, associated with the presence of a feature, such as a stud, beam, or electrical wiring.

18 Claims, 8 Drawing Sheets

U.S. PATENT DOCUMENTS

| | | |
|---|---|---|
| 6,377,009 B1 | 4/2002 | Philipp |
| 6,446,012 B1 | 9/2002 | Macke, Sr. et al. |
| 6,452,514 B1 | 9/2002 | Philipp |
| 6,457,355 B1 | 10/2002 | Philipp |
| 6,466,036 B1 | 10/2002 | Philipp |
| 6,501,414 B2 | 12/2002 | Arndt et al. |
| 6,535,200 B2 | 3/2003 | Philipp |
| 6,844,713 B2 | 1/2005 | Steber et al. |
| 6,894,508 B2 * | 5/2005 | Sanoner et al. ............... 324/662 |
| 6,989,662 B2 | 1/2006 | Heger et al. |
| 6,993,607 B2 | 1/2006 | Philipp |
| 7,013,570 B2 | 3/2006 | Levine et al. |
| 7,106,072 B2 | 9/2006 | Clauss et al. |
| 7,116,091 B2 | 10/2006 | Miller |
| 7,148,703 B2 | 12/2006 | Miller |
| 7,212,014 B2 | 5/2007 | Krantz |
| 7,256,587 B2 | 8/2007 | Sanoner et al. |
| 7,288,945 B2 | 10/2007 | Martinez et al. |
| 7,316,073 B2 | 1/2008 | Murray |
| 7,409,765 B2 * | 8/2008 | So .................. 30/123 |
| 2005/0138886 A1 | 6/2005 | Sanoner |
| 2005/0194959 A1 | 9/2005 | Miller |
| 2008/0238403 A1 | 10/2008 | Sanoner |
| 2011/0215818 A1 * | 9/2011 | Dorrough .................... 324/679 |

* cited by examiner

OBSCURED FEATURE DETECTOR AND METHOD

CROSS REFERENCE TO RELATED APPLICATIONS

This application claims the benefit of the following patent applications: U.S. Provisional Patent Application No. 61/339,316, entitled "MATERIAL DETECTOR THAT OPERATES FROM A STATIONARY POSITION" and filed on Mar. 4, 2010; U.S. Provisional Patent Application No. 61/333,252, entitled "MATERIAL DETECTOR THAT OPERATES FROM A STATIONARY POSITION" and filed on May 10, 2010; U.S. Provisional Patent Application No. 61/345,591, entitled "MATERIAL DETECTOR THAT OPERATES FROM A STATIONARY POSITION" and filed on May 17, 2010. The entire contents of these patent applications are incorporated by reference herein.

BACKGROUND

1. Technical Field

The present disclosure relates generally to devices used for detecting the presence of obscured features behind opaque, solid surfaces, more specifically, devices used for locating beams and studs behind walls and joists beneath floors.

2. Background

The need to locate obscured features such as beams, studs, joists and other support elements behind walls and beneath floors is a common problem encountered during construction, repair and home improvement activities. Often a need exists to cut or drill into a supported surface with the aim of creating an opening in the surface while avoiding the underlying support elements. In these instances, it is desirable to know where the support elements are positioned before beginning so as to avoid cutting or drilling into them. On other occasions, one may desire to anchor a heavy object to the obscured support element. In these cases, it is often desirable to install a fastener through the surface in alignment with the underlying support element. However, once the wall, floor or surface is in place, the location of the support element is not visually detectable.

A variety of rudimentary techniques have been employed with limited success to address this problem in the past. These have included driving small pilot nails through the surface until a support element is detected and then covering over holes in the surface that did not reveal the location of the stud or support. A less destructive technique comprises tapping on the surface in question with the aim of detecting audible changes in the sound which emanates from the surface when there is a support element beneath or behind the area being tapped. This technique is not very effective, however, because the accuracy of the results depend greatly on the judgment and skill of the person searching for the support, and because the sound emitted by the tapping is heavily influenced by the type and density of the surface being examined.

Magnetic detectors have also been employed to find obscured support elements with the detector relying on the presence of metallic fasteners, such as nails or screws, in the wall and support element to trigger a response in the detector. However, since metallic fasteners are spaced at discreet locations along the length of a support, a magnetic detector may pass over a length of the support where no fasteners are located, thereby failing to detect the presence of the obscured support element.

Capacitive displacement sensors have also been employed to detect obscured features behind opaque surfaces. These detectors sense changes in capacitance on the examined surface that result from the presence of features positioned behind, beneath or within the surface. These changes in capacitance are detectable through a variety of surfaces such as wood, sheet-rock, plaster, gypsum and do not rely on the presence of metal fasteners in the surface or obscured feature for activation of the sensor.

However, conventional capacitive sensors often suffer from a number of shortcomings. For example, conventional capacitive sensors typically require movement across an examined surface, sometimes repeatedly, to effectively locate an obscured feature or support element. In addition, capacitive sensors generally can only locate one feature at a time, and often can only find the edge of the feature rather than its center point. Some capacitive sensors rely on an assumed width of a feature to calculate the location of the center of the feature based on detection of the edge. Such devices frequently require a comparison circuit in addition to a sensing circuit in order to compare capacitances sensed by different sensors.

SUMMARY

The present disclosure advantageously addresses one or more of the aforementioned deficiencies in the field of obscured feature detection by providing an accurate, simple to use and inexpensively manufactured obscured feature detector. The detector can be employed by placing the device in a stationary position against the examined surface and reading the location of all features present beneath the surface where the device is positioned without having to move it back and forth across the surface.

In one embodiment, an obscured feature detector comprises a plurality of sensor plates, each having a capacitance that varies based on: (a) the proximity of the sensor plate to one or more surrounding objects; and (b) the dielectric constant(s) of the surrounding object(s). The obscured feature detector further comprises a sensing circuit coupled to the sensor plates and a controller coupled to the sensing circuit. The sensing circuit is configured to measure the capacitances of the sensor plates, and the controller is configured to analyze the capacitances measured by the sensing circuit to identify sensor plates located in one or more regions of relative high capacitance, as well as sensor plates located in one or more regions of relative low capacitance. The obscured feature detector further comprises a plurality of indicators coupled to the controller, each indicator capable of toggling between a deactivated state and an activated state. The controller is configured to activate one or more of the indicators to identify the location of region(s) of relative high capacitance.

In another embodiment, a stationary obscured feature detector comprises a housing having a top, a bottom, and an interior cavity, with a handle located near the top. The housing is configured to be placed against a surface at a first location to detect the presence of one or more features obscured by the surface near the first location, without requiring movement of the stationary obscured feature detector. The stationary obscured feature detector further comprises a plurality of sensor plates arrayed substantially in a plane near the bottom of the housing. Each sensor plate has a capacitance that varies based on: (a) the proximity of the sensor plate to one or more surrounding objects; and (b) the dielectric constant(s) of the surrounding object(s). The stationary obscured feature detector further comprises a sensing circuit located in the interior cavity of the housing and coupled to the sensor plates, a controller located in the interior cavity of the housing and coupled to the sensing circuit, and a plurality of indicators located near the top of the housing and coupled to the controller. The sensing circuit is configured to transmit charge to the sensor plates and read the capacitances of the sensor plates. The controller is configured to analyze the capacitances measured by the sensing circuit and control the indicators to identify the location of the feature(s) obscured by the surface near the first location.

In another embodiment, a method of detecting an obscured feature behind a surface comprises placing an obscured feature detector in a stationary position on the surface. The obscured feature detector has a plurality of sensor plates arranged in an array. The method further comprises measuring capacitance readings sensed in a plurality of regions, each region corresponding to an area surrounding one or more of the sensor plates, and comparing the sensed capacitance readings in different regions. The method further comprises identifying, based on the compared capacitance readings, one or more regions of relative high capacitance, and activating one or more indicators corresponding to the location of the region(s) of relative high capacitance.

In some embodiments, the obscured feature detector comprises at least four sensor plates. In some embodiments, the obscured feature detector comprises a housing having a longitudinal axis with a length of at least about 6". In some embodiments, a dedicated sensing circuit is connected to each sensor plate.

In some embodiments, sensor plates are electrically connected together in groups of two or more in order to improve signal to noise ratio without the loss of detection resolution that would result from the use of wider plates. In some embodiments, comparative measurements are made between individual sensor plates, or various groups of sensor plates.

In some embodiments, one or more non-active sensor plates can be left at a high impedance floating potential. This may result in increased sensitivity for some combinations of groups of active sensor plates.

In some embodiments, the indicators are arrayed along one of the edges of the housing parallel with a longitudinal axis of the housing. In some embodiments, the ratio of indicators to sensor plates is other than 1:1. In some embodiments, the indicators do not change states while the capacitance sensing circuit is active, in order to minimize interference with the sensing operation.

In some embodiments, the obscured feature detector may simultaneously locate and indicate the presence of more than one feature beneath an examined surface.

In some embodiments, the obscured feature detector includes a re-chargeable battery or a fuel cell.

In some embodiments, the obscured feature detector is at least 16" long so that it immediately detects at least one support when placed in a stationary and horizontal orientation against a wall in a modern US home where support studs are spaced at 16" intervals from center to center.

A novel and non-obvious feature of the obscured feature detector and associated method is the ability to locate obscured features without having to move the detector across the examined surface. The obscured feature detector may be used by placing it in a stationary position on the surface to be examined. This obviates the need to slide the obscured feature detector back and forth along the surface in order to detect a feature, thereby allowing a user to better observe and mark the position of the feature.

Another novel and non-obvious feature of the obscured feature detector is the ability to simultaneously locate more than one obscured feature positioned beneath the detector.

Another novel and non-obvious feature is the use of only one capacitance-to-digital converter to sense a plurality of sensor plates, or groups of sensor plates, individually and sequentially. This technique is in contrast with the more common approach of using a separate capacitance-detecting circuit for each sensor plate.

Another novel and non-obvious feature is the detection of supports by the use of absolute changes in capacitance in each individual sensor plate instead of ratiometric comparisons between adjacent plates. As a result, the obscured feature detector can advantageously sense and indicate the location of features of various shapes and/or widths.

Still another novel and non-obvious feature of the obscured feature detector is the ability to indicate the presence of obscured features anywhere along the length of the obscured feature detector instead of just at the center-point of the detector.

The present disclosure will now be described more fully with reference to the accompanying drawings, which are intended to be read in conjunction with both this summary, the detailed description, and any preferred or particular embodiments specifically discussed or otherwise disclosed. This disclosure may, however, be embodied in many different forms and should not be construed as limited to the embodiments set forth herein; rather, these embodiments are provided by way of illustration only so that this disclosure will be thorough, and fully convey the full scope of the invention to those skilled in the art.

DETAILED DESCRIPTION

Figure 1A:
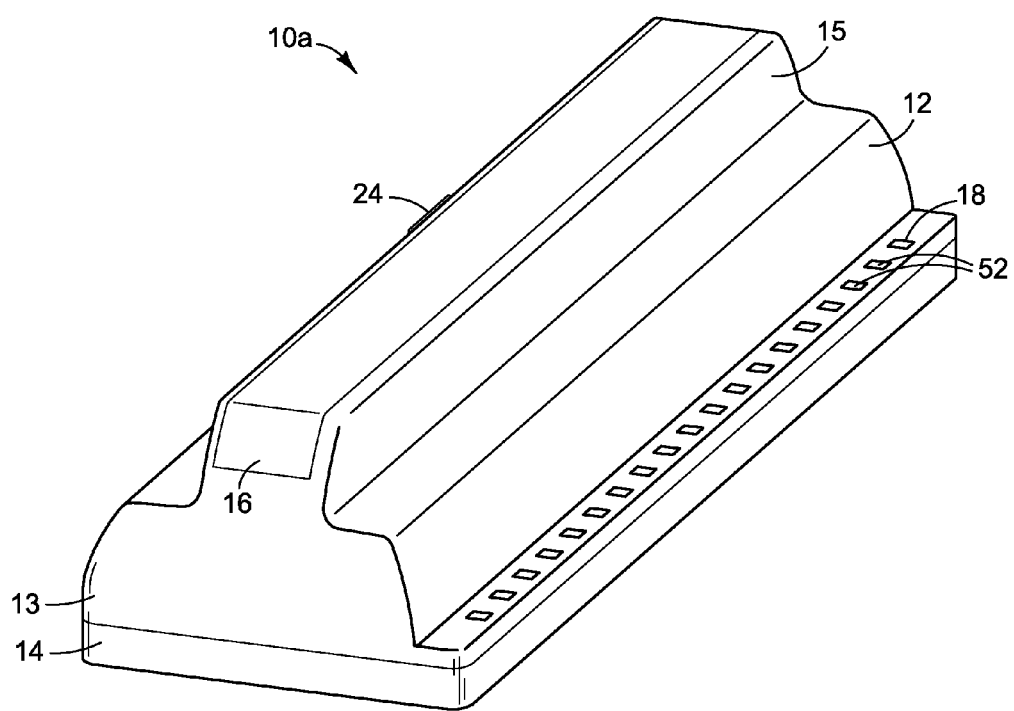
FIG. 1A illustrates a perspective view of a first embodiment of an obscured feature detector.

In the following description, reference is made to the accompanying drawings that form a part thereof, and in which is shown by way of illustration specific exemplary embodiments in which the invention may be practiced. These embodiments are described in sufficient detail to enable those skilled in the art to practice the invention, and it is to be understood that modifications to the various disclosed embodiments may be made, and other embodiments may be utilized, without departing from the spirit and scope of the present invention. The following detailed description is, therefore, not to be taken in a limiting sense.

To provide context for the disclosure it may be useful to understand how capacitance is used to detect obscured features behind a surface. Capacitance is an electrical measure of an object's ability to hold or store charge. A common form of an energy storage device is the parallel plate capacitor whose capacitance is calculated by: $C = \varepsilon_r \varepsilon_o A/d$, where A is the overlapping area of the parallel plates, d is the distance between the plates and $\varepsilon_r$ is the relative static permittivity, or dielectric constant of the material between the plates. $\varepsilon_o$ is a constant. The dielectric constant ($\varepsilon_r$) of air is one, while most solid non-conductive materials have a dielectric constant greater than one. Generally, the increased dielectric constants of non-conductive solids enable conventional capacitive displacement sensors to work.

In their most rudimentary form, capacitive sensors are in part single-plate capacitive sensors. These single-plate capacitive sensors use the environment surrounding them as the dielectric where the second plate can be assumed to be infinitely far away. The plates will also form capacitors with other metal plates. When two plates are positioned against a wall, they are not facing each other as is suggested by the definition of a capacitor. Nonetheless, the stray fields emanating from the edges of each of the adjacent plates do extend into the wall and behind it, and curve back to the adjacent plate, allowing the two plates to sense the capacitance of the surface and the space behind the surface.

When the plates are placed on a wall at a location with no support behind the wall, the detector measures the capacitance of the wall and the air behind it. When placed in a position having a support behind the wall, the detector then measures the capacitance of the wall and the support, which has a higher dielectric constant than air. As a consequence, the detector registers an increase in capacitance which can then be used to trigger an indicating system.

This description of feature sensing through capacitive sensing is provided in order to facilitate an understanding of the disclosure. Persons of skill in the art will appreciate that the scope and nature of the disclosure is not limited by the description provided.

The present disclosure is directed to an obscured feature detector. In the exemplary embodiments illustrated in FIGS. 1-7, the obscured feature detector 10 comprises a sensor plate array 31 (see FIG. 2), a multi-layer printed circuit board 40 (see FIG. 5), a charging and sensing circuit 30 (see FIG. 3), a controller 60 (see FIGS. 3-5), a display circuit 50 (see FIG. 3), a plurality of indicators 52 (see FIGS. 1, 3, 5), a power controller 20 (see FIG. 3) and a housing 12 (see FIGS. 1, 5).

Figure 2:
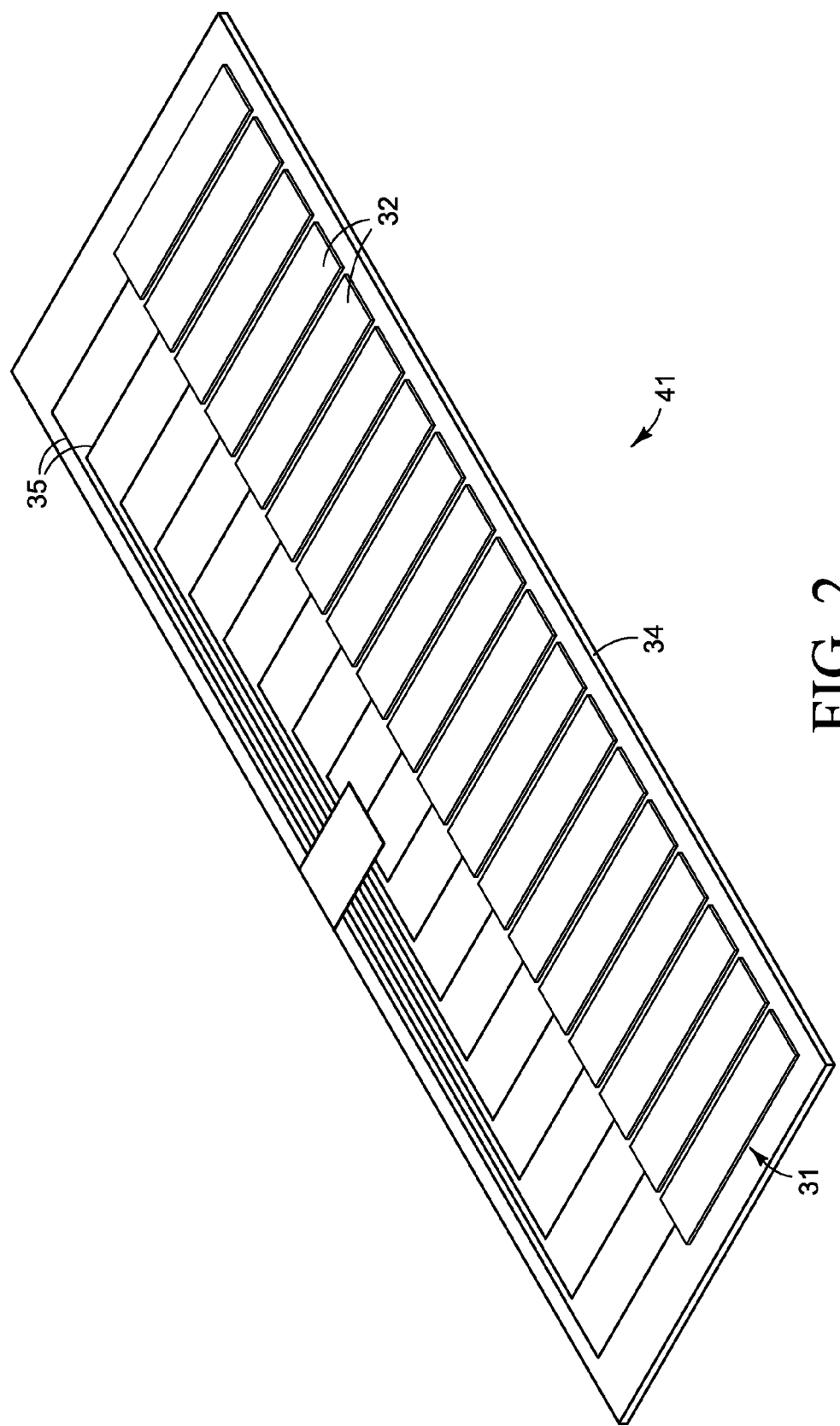
FIG. 2 is a perspective view of a sensor plate array suitable for use with an obscured feature detector.

In some embodiments, as shown in FIG. 2, the sensor plate array 31 comprises a plurality of sensor plates 32 arranged in a planar array. Each sensor plate 32 has a capacitance that varies based on: (a) the proximity of the sensor plate 32 to one or more surrounding objects, and (b) the dielectric constant(s) of the surrounding object(s). Thus, by evaluating the capacitances of the sensor plates 32, the sensor plate array 31 is capable of sensing the presence and location of one or more features 82 obscured by a surface 80 (see FIG. 6) in contact or proximity with the obscured feature detector 10.

The sensor plates 32 may be positioned side by side in a linear arrangement so that a longitudinal axis of the array 31 is substantially perpendicular to a longitudinal axis of the individual sensor plates 32. The individual plates 32 may comprise thin, conductive surfaces and may be manufactured using a variety of suitable techniques, such as, for example, depositing conductive ink on a substrate 34 or applying thin sheets of conductive material to the substrate 34.

Figure 5:
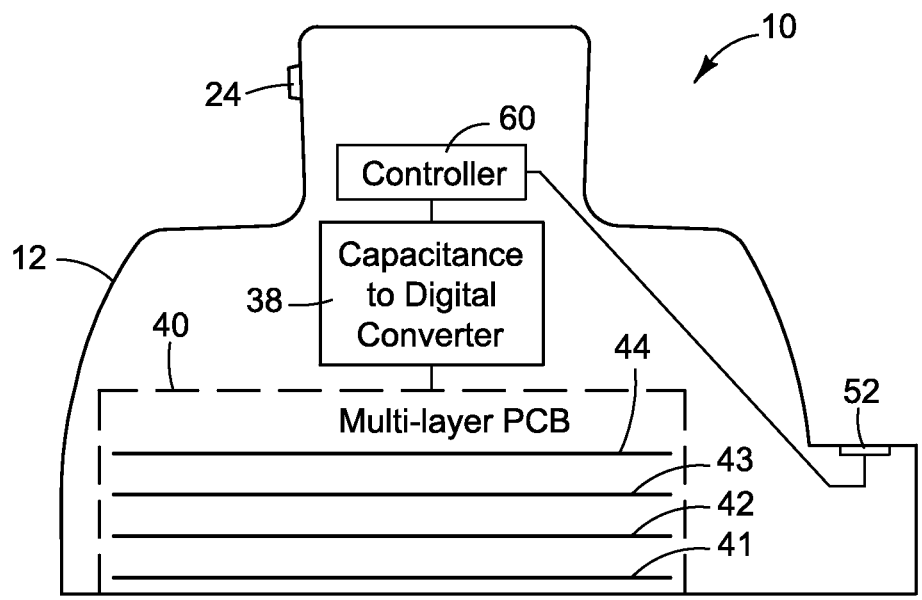
FIG. 5 is a cross sectional view of an obscured feature detector with a block diagram of a charging and sensing circuit projected on the cross-section.
Figure 6:
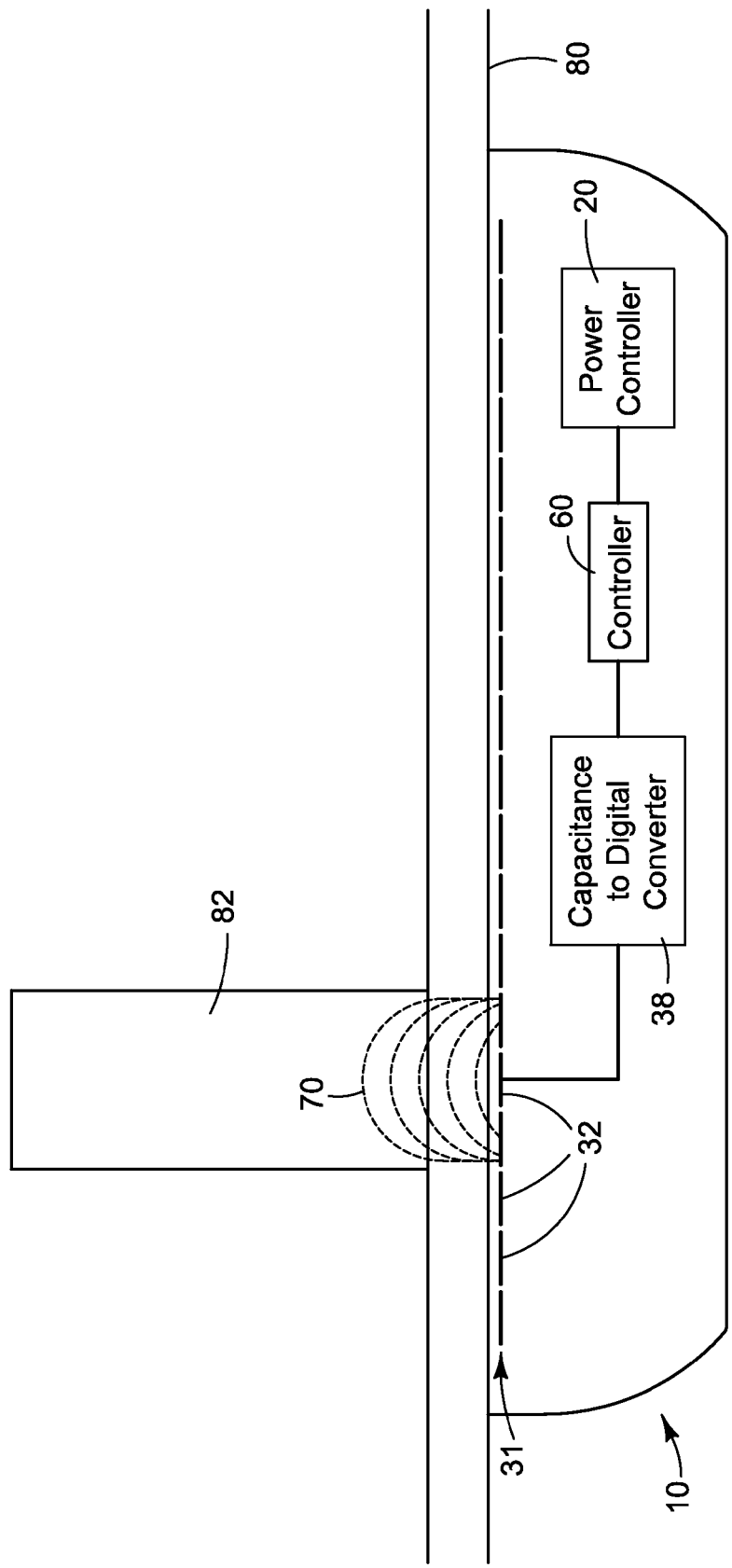
FIG. 6 is a cross sectional view of an obscured feature detector while in use on an examined surface having an obscured feature.
Figure 7:
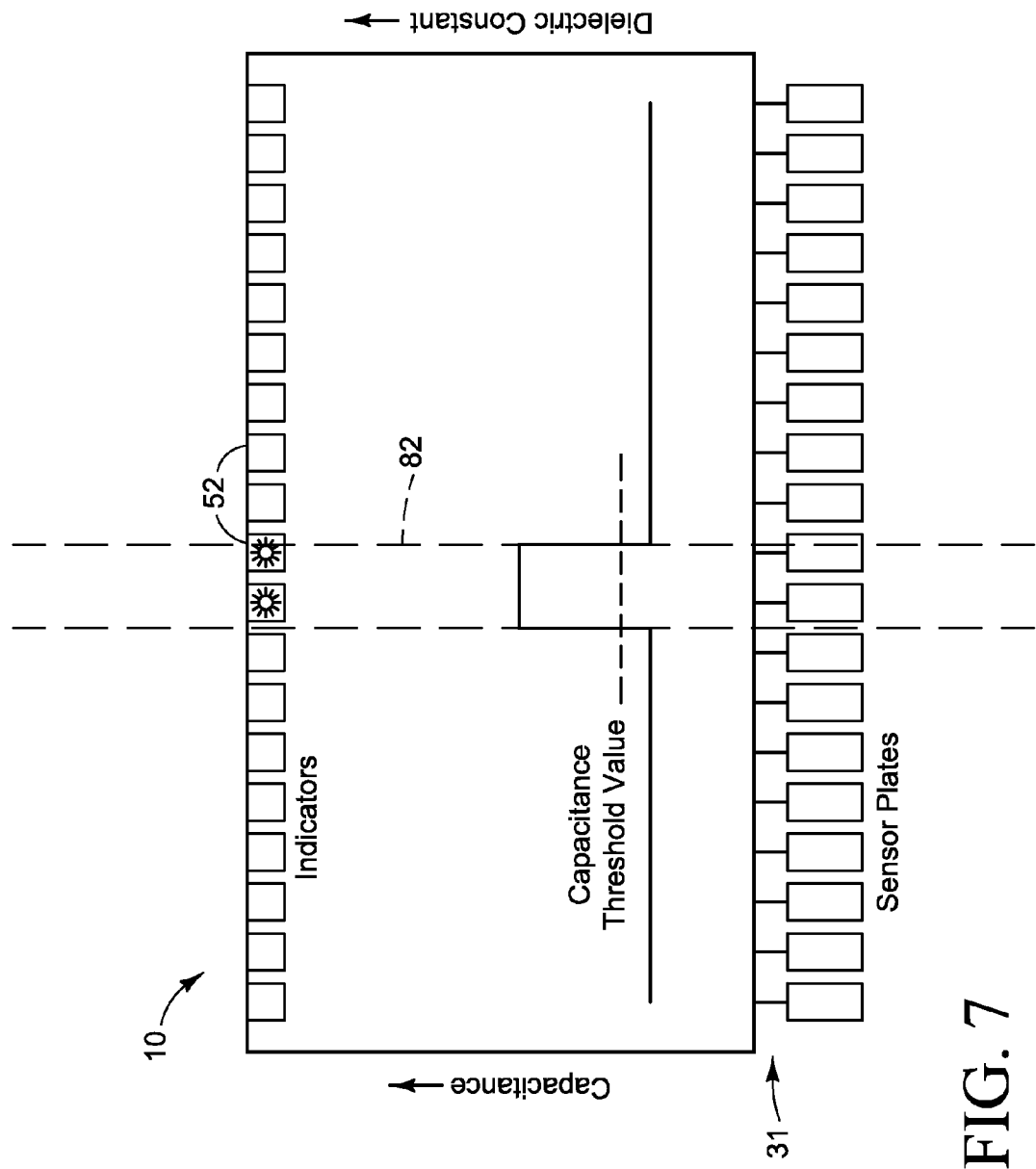
FIG. 7 illustrates the response of the indicators of an obscured feature detector to the increased capacitance caused by the detection of an obscured feature.

In some embodiments, each individual sensor plate 32 of the array 31 is independently connected to the charging and sensing circuit 30 (see FIG. 3), and the array 31 itself is attached to the exposed side of the bottom layer 41 of the printed circuit board 40 which is positioned facing the underside of the detector 10 (see FIG. 5). In some embodiments, the obscured feature detector 10 has at least four sensor plates 32, which advantageously enables the obscured feature detector 10 to detect the full width of a common obscured feature 82, such as a stud, from a stationary position. By contrast, many existing stud detectors with fewer than four sensor plates cannot detect the full width of a stud without being moved.

In some embodiments, as shown in FIG. 5, the printed circuit board 40 comprises a multi-layer board with a bottom layer comprising a sensor board 41 on which the sensor plate array 31 is placed, two middle layers comprising a power plane board 42 and a ground plane board 43 respectively, and a top layer comprising a metal shielding board 44. In other embodiments the sensor plate array 31 may be placed on a middle layer of the printed circuit board 40 to provide an insulating layer to protect the circuits from static discharge. Placing the sensor plates 32 on a middle layer may have the added benefit of minimizing the expansions and contractions of the sensor plates 32 as the printed circuit board 40 is flexed.

In some embodiments, the printed circuit board 40 may be external to the material detector housing 12 and the circuits are only protected by the external layer, or layers, of the printed circuit board 40. The printed circuit board 40 may be made from a variety of suitable materials, such as, for example, FR-4, FR-406, or more advanced materials used in radio frequency circuits, such as Rogers 4003C. Rogers 4003C may offer improved temperature stability. In the embodiment illustrated in FIG. 5, the printed circuit board 40 is positioned inside the housing 12 with the sensor board 41 containing the sensor plate array 31 oriented toward the underside of the obscured feature detector 10 and the shielding board 44 positioned as the top layer of the printed circuit board 40 immediately beneath the housing 12.

Figure 3:
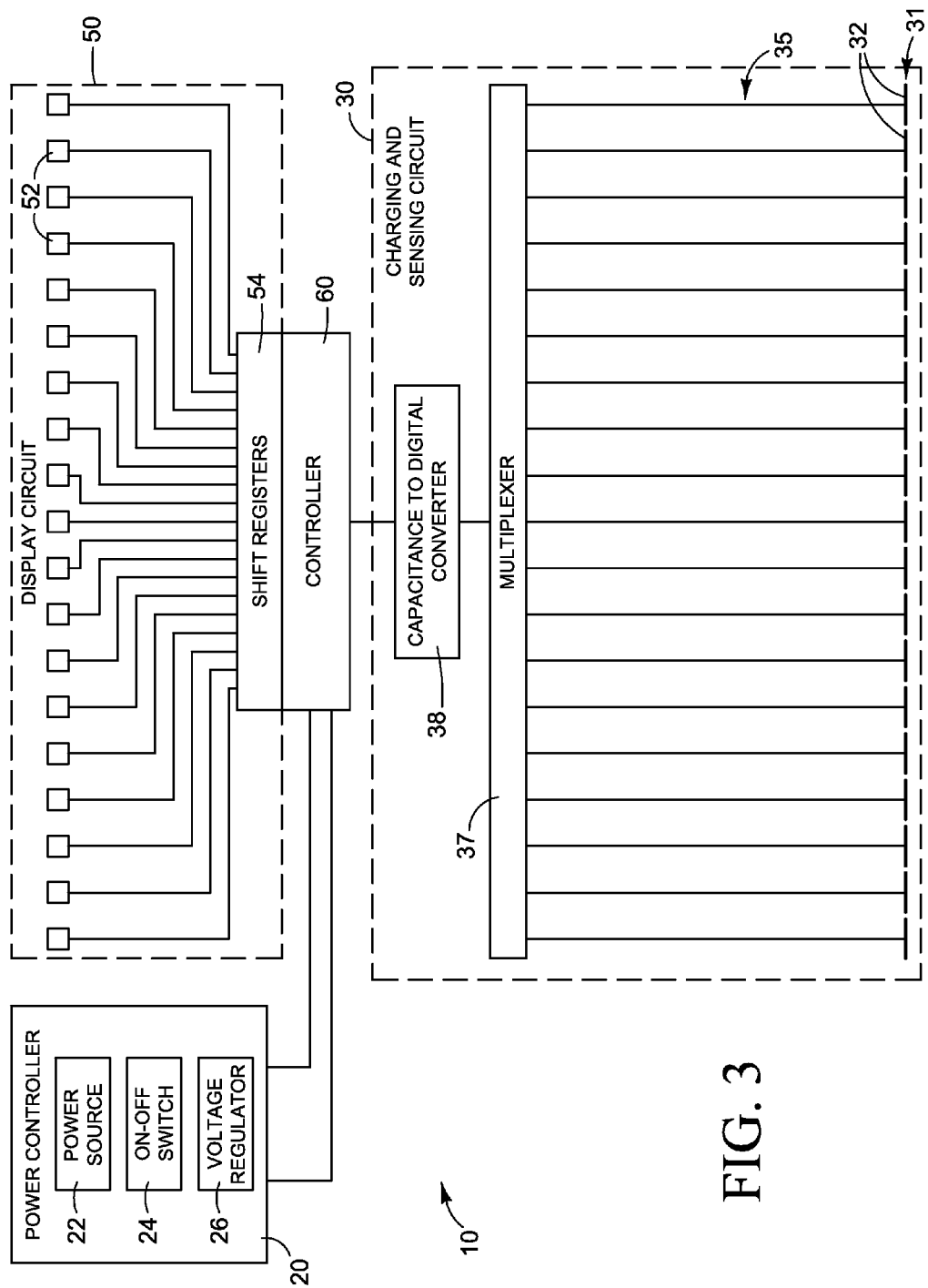
FIG. 3 is a block diagram of certain functional components of an obscured feature detector.

In some embodiments, as shown in FIG. 3, the charging and sensing circuit 30 comprises a plurality of electrical traces 35, a multiplexer 37, and a capacitance-to-digital converter 38. The charging and sensing circuit 30 may be connected to the controller 60. In some embodiments, each of the electrical traces 35 between the controller 60 and the sensor plates 32 have substantially the same length and width. As a result, the traces 35 have substantially similar electrical properties (resistance, capacitance, and inductance) and substantially similar response to environmental conditions, such as temperature. The electrical traces 35 may comprise conductive paths on the printed circuit board 40, which connect the individual sensor plates 32 to the input port of the controller 60. As a result, the sensor plates 32 may be individually connected to the charging and sensing circuit 30.

Figure 4:
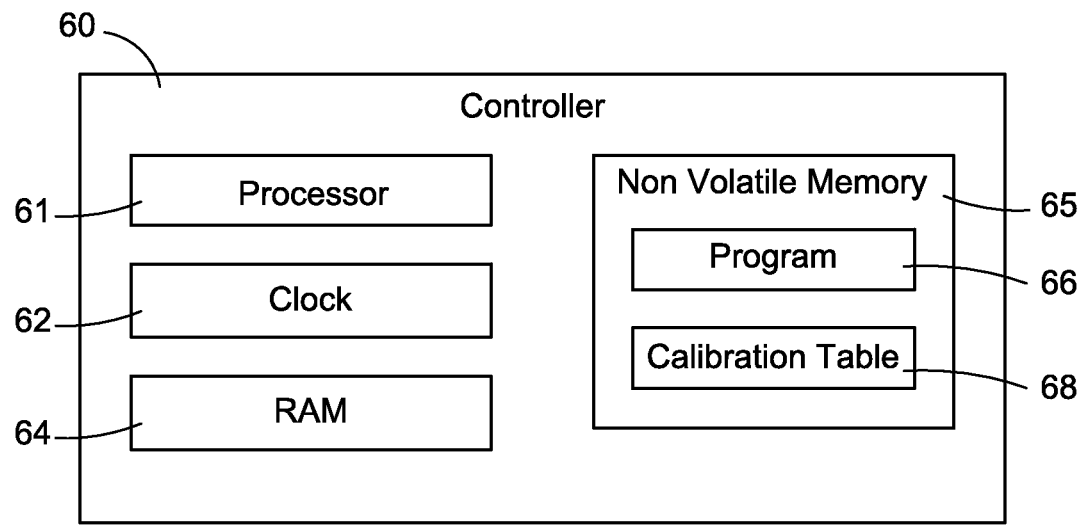
FIG. 4 is a block diagram of a controller suitable for use with an obscured feature detector.

In some embodiments, as shown in FIG. 4, the controller 60 comprises a processor 61, a clock 62, a random access memory (RAM) 64, and a non-volatile memory 65, In operation, the controller 60 receives programmable code 66 and synchronizes the functions of the charging and sensing circuit 30 with the display circuit 50 (see FIG. 3). The clock 62, which may be integrated into the controller 60, times and switches the connection of the individual sensor plates 32 to the charging and sensing circuit 30. The non-volatile memory 65 receives and holds the programmable code 66 as well as look-up tables (LUT) and calibration tables 68. The programmable code 66 may include number of suitable algorithms, such as, for example, an initialization algorithm, a calibration algorithm, a base-lining algorithm, a charging and sensing algorithm, a proximal sensor zeroing algorithm, a multiplexing algorithm, a display management algorithm, an active sensor activation algorithm, and a non-active sensor management algorithm.

In some embodiments, as shown in FIG. 3, the display circuit 50 comprises a plurality of shift registers 54 and a plurality of indicators 52. The shift registers 54 may be connected in series between the controller 60 and the indicators 52. In operation, the shift registers 54 may transmit state change signals generated by the controller 60 to an indicator 52 corresponding to a sensor plate 32 that detects a capacitance level indicating the presence of a feature 82 (see FIG. 6), such as a stud or support. The indicators 52 may comprise LEDs, LCD displays, incandescent bulbs, or other suitable indicators. In the embodiments illustrated in FIGS. 1A and 1B, the indicators 52 are positioned in receptacles 18 in the backside of the housing 12 in one or more linear arrays, with each individual indicator 52 aligned with a corresponding sensor plate 32 to which the indicator 52 is connected through the display circuit 50.

Figure 1B:
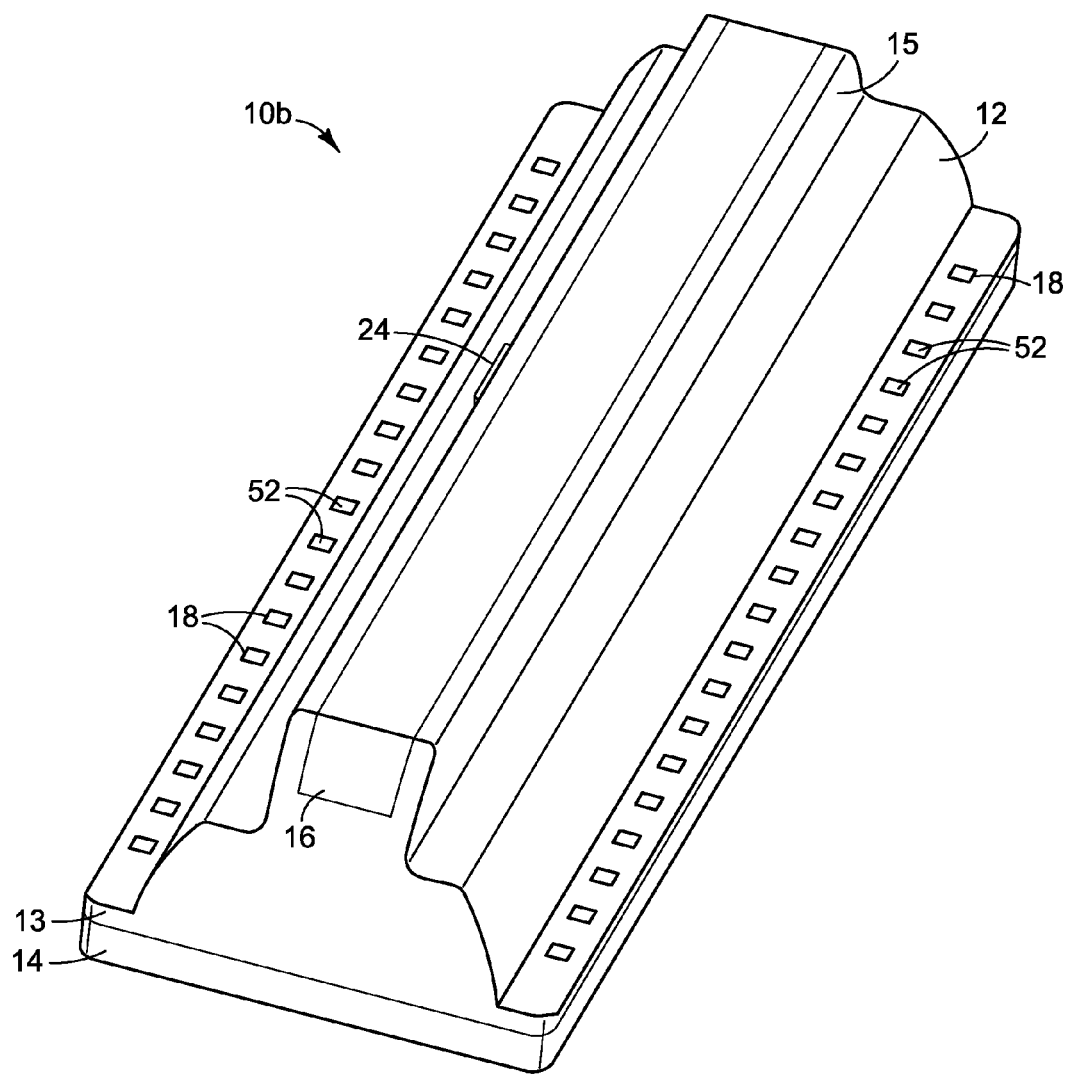
FIG. 1B illustrates a perspective view of a second embodiment of an obscured feature detector.

In some embodiments, as shown in FIGS. 1A and 1B, the housing 12 comprises an upper housing 13, a lower housing 14, an on/off switch 24, a handle 15, a plurality of receptacles 18 and a power supply compartment 16. The upper housing 13 may contain the multi-layered printed circuit board 40, the charging and sensing circuit 30, the display circuit 50, and the controller 60 in an interior cavity. In some embodiments, the housing 12 may be made of a variety of dielectric materials, including but not limited to ABS plastic, PVC, acetal, or nylon. The lower housing 14 may comprise a thin dielectric plate that mates with the upper housing 13 and covers the downward-facing sensor plate array 31 to protect it from damage. The lower housing 14 may be fastened to the upper housing 13 using a variety of suitable techniques, such as, for example, screws or a snap mechanism.

In some embodiments, the handle 15 comprises a gripping surface positioned orthogonally from the back plane of the upper housing 13. The handle 15 is preferably positioned so that the user's hand does not obscure the view of the indicators 52 when grasping the handle 15. In some embodiments, the power supply compartment 16 comprises a cavity for holding a suitable power supply, such as batteries or a fuel cell, and a cover for accessing the compartment 16.

In some embodiments, as shown in FIG. 3, the obscured feature detector 10 comprises a power controller 20 having a power source 22, an on-off switch 24, and a voltage regulator 26. The power source 22 may comprise an energy source for charging the sensor plates 32, powering the indicators 52, and supplying power to the capacitance charging and sensing circuit 30, the controller 60 and the display circuit 50. In some embodiments, the power source 22 may comprise a DC battery supply or an AC adapted power supply. The on-off switch 24 may be used to activate the sensor plate array 31 and other components of the obscured feature detector 10 when it is placed on or near a surface 80, as described above. In some embodiments, the on-off switch 24 comprises a push button mechanism that activates components of the obscured feature detector 10 for a selected time period. In some embodiments the on-off switch 24 comprises a capacitive sensor that may sense the presence of a finger, or thumb over the button. In some embodiments, the on-off switch 24 may comprise a toggle switch, or other types of buttons or switches. The voltage regulator 26 may be used to condition the output of the power controller 20, as desired.

In operation, the charging and sensing circuit 30 may implement a capacitance-to-digital conversion process. As an initial step, the obscured feature detector 10 can be placed in a stationary position against a surface 80 to be examined and activated using the on-off switch 24, as described above. The charging and sensing circuit 30 may then individually charge a first sensor plate 32 of the obscured feature detector 10. In subsequent iterations of the capacitance-to-digital conversion process, additional sensor plates 32 in the sensor plate array 31 can be charged sequentially by the charging and sensing circuit 30. In some embodiments, to maintain appropriate levels of sensitivity, non-active sensor plates 32 (e.g., those not connected to the charging and sensing circuit 30 at any given moment), are positively controlled by a suitable method, such as allowing them to float in a high-impedance state, driving them to ground potential, or driving them to the same potential as the shielding board 44 of the multi-layer PCB 40.

Once a first sensor plate 32 has been charged, the charging and sensing circuit 30 allows the charged sensor plate 32 to share the charge with a modulation capacitor, which may be connected to the sensor plate 32 in series through a modulation resistor. The voltage of the modulation capacitor can then be measured and compared against a reference voltage. The charge sharing process is repeated iteratively until the voltage on the modulation capacitor reaches the reference voltage. In some embodiments, the controller 60 counts the number of iterations that occur before the modulation capacitor reaches the reference voltage. This count indicates the capacitance of the sensor plate 32, with lower counts corresponding to greater capacitances. Once the capacitance of the first sensor plate 32 has been determined, the capacitance-to-digital conversion process can be repeated sequentially for the remaining sensor plates 32 to determine their respective capacitances.

Figure 8:
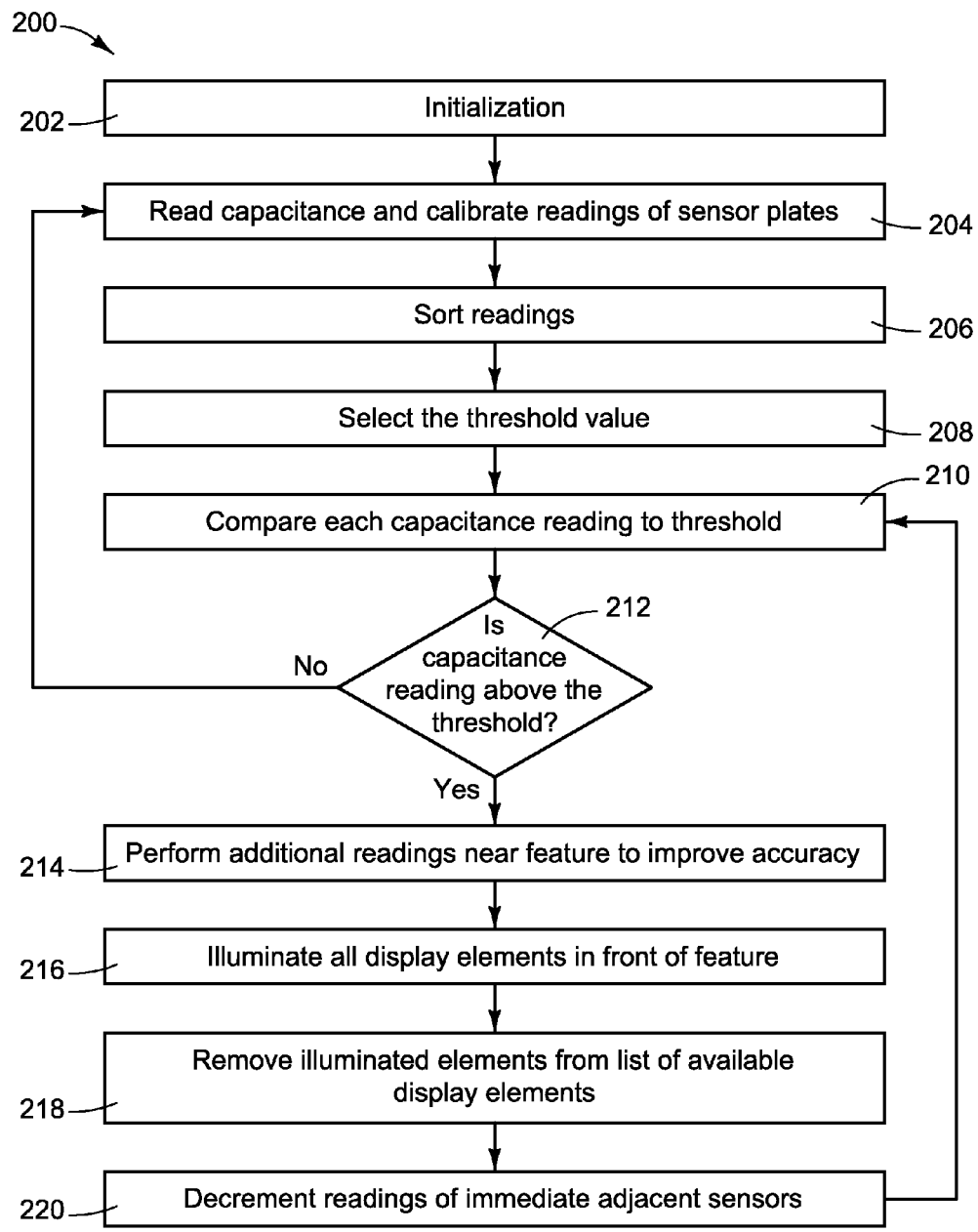
FIG. 8 is a flow diagram showing a feature detection process implemented in some embodiments of an obscured feature detector.

FIG. 8 is a flow diagram showing a feature detection process 200 implemented in some embodiments of the obscured feature detector 10. The detection process 200 begins with a first step 202, in which the obscured feature detector 10 is initialized and/or calibrated. In some embodiments, initialization occurs automatically after the obscured feature detector 10 is turned on. Calibration can advantageously compensate for differences in the sensor plates 32, such as differences in dielectric constant, plate size and trace length, all of which can have an effect on the accuracy of the readings. In some embodiments, a two-dimensional calibration table 68 is applied to the sensor plates 32, which enables them to produce similar readings in response to similar capacitive loads. In some embodiments, the two-dimensional calibration table 68 compensates for temperature variations and may provide separate temperature calibration depending on the sensed capacitive load.

Referring again to FIG. 8, in a next step 204, the capacitance of each sensor plate 32 is measured individually. In a next step 206, the controller 60 sorts the measured capacitance readings in ascending or descending order to determine the relative capacitance values of the individual sensor plates 32. In a step 208, the controller 60 analyzes the sorted capacitance values of the sensor plates 32 to identify one or more regions of relative high capacitance and relative low capacitance in the area of the sensor plates 32. In some embodiments, the controller determines an appropriate threshold value, or baseline, indicating the presence of a possible obscured feature 82. This process, sometimes referred to as base-lining, can "teach" the obscured feature detector 10 what the capacitive load of the examined surface 80 is, so it can factor out that load when evaluating signals. For example, in some embodiments, the controller 60 may select the third lowest capacitance measurement as the threshold, or baseline, value.

In a step 210, the calibrated capacitance of the sensor plate 32 with the highest capacitance reading is compared against the selected threshold value. In a decision step 212, a determination is made as to whether this highest calibrated capacitance reading exceeds the threshold value. If not, processing returns to step 204, and the intervening steps are repeated until at least one sensor plate 32 reaches a calibrated capacitance reading that exceeds the selected threshold value. Once the results of decision step 212 indicate that the maximum capacitance reading exceeds the threshold, then in a step 214, the charging and sensing circuit 30 performs additional capacitance readings of the sensor plates 32 near the one reporting the highest capacitance. These additional measurements advantageously enable the obscured feature detector 10 to determine the location of the feature 82 more precisely. In a next step 216, the appropriate indicators 52 are illuminated to indicate the location of the obscured feature 82 to the user. For example, in some embodiments, the controller 60 transmits a signal through the shift registers 54 of the display circuit 50 to activate the indicators 52 that correspond to the sensor plates 32 registering capacitance values that indicate the presence of the obscured feature 82.

In some embodiments, the differences in capacitance readings between adjacent regions are compared to identify the boundaries between high capacitance regions and low capacitance regions. Once the boundaries between high capacitance regions and low capacitance regions are identified, then indicators are illuminated over the high capacitance regions.

In some embodiments, the capacitance readings are compared to pre-identified patterns to identify the location of obscured features 82. In one example of one particular pattern, a region of three high capacitance readings surrounded by low capacitance readings is used to identify the location of a single object about one and half inches wide, that may correspond to a stud. In another example of a particular pattern, a region of six high capacitance readings surrounded by low capacitance regions is used to identify the location of an object about three inches wide, that may correspond to the location of two studs located side by side.

In some embodiments, algorithms use triangulation to locate one or more obscured features 82. In such embodiments, an assumption is typically made that the distance to an object is inversely proportional to the capacitance reading. Using this assumption, the location of an obscured feature 82 can be determined by using a triangle with the known location of two sensor plates 32 and the inverse of the capacitance readings as the vertices of the triangle.

In other embodiments, different algorithms are utilized that use capacitance readings in other ways to identify the location of obscured features 82. In some embodiments, various combinations of different algorithms are utilized to identify the location of obscured features 82.

Referring again to FIG. 8, in a next step 218, the illuminated indicators 52 are eliminated from the list of available display elements. In a step 220, the controller 60 decrements the capacitance readings of sensor plates 32 adjacent to those indicating the presence of the obscured feature 82. These decrementing adjustments are made to reduce the possibility of a "false positive" indication of an additional obscured feature 82. In some cases, sensor plates 32 that are near, but not over, an obscured feature 82 will signal an increase in capacitance greater than the selected threshold value. Thus, if no decrementing adjustment is made, the controller 60 may misinterpret those readings as being indicative of an additional obscured feature 82.

Once the decrementing adjustments are made in step 220, processing returns to step 210, at which the obscured feature detector 10 checks for additional obscured features 82 by comparing the highest remaining capacitance measurement against the selected threshold value. The process steps described above are repeated, except that sensor plates 32 already acknowledged by the controller 60 as having detected an obscured feature 82 are not evaluated again. In some embodiments, to minimize electrical noise during the capacitance sensing, the controller 60 does not change the state of the indicators 52 while the charging and sensing circuit 30 is active.

In some embodiments, to improve the signal to noise ratio, adjacent sensor plates 32 may be electrically connected in groups of two, three or more plates in a rolling sweep, thereby effectively increasing the plate size without increasing the overall size of the obscured feature detector 10. For example, in some embodiments, the first, second and third sensor plates 32 may be grouped together and read as one, followed by the second, third and fourth sensor plates 32 being grouped together and read as one, and so on. This grouping can be accomplished by connecting multiple sensor plates to the capacitance to digital converter 38 using the multiplexer 37.

Another technique for reducing signal to noise ratio is to read the sensor plates 32 in groups of one, two, three, or more. The groups of sensor plates 32 sampled may be adjacent during some scans, and not adjacent during others. For example, in some embodiments, the second sensor plate 32 is sensed individually, followed by the first, second and third sensor plates 32 being grouped together and sensed as a unit. These two readings are then combined by the controller 60 before adjusting the state of the associated indicators 52.

In some embodiments, differential detection is employed, whereby one group of sensor plates 32 is compared to an alternate group of sensor plates 32. The groups of compared sensor plates 32 may, or may not, be adjacent. Each group of compared sensor plates 32 may comprise one or more sensor plates 32. Many combinations are possible. Those skilled in the art can determine which of the many combinations are most suitable for a desired design. Combining the readings from a variety of different combinations of readings, including both differential and non-differential readings, can provide composite readings that can detect more deeply, with more accuracy, and less noise.

In one particular example, the obscured feature detector 10 comprises nineteen sensor plates 32 arrayed side by side in vertical orientation along the longitudinal axis of the detector 10, with a gap of approximately 1.7 mm between adjacent plates. In this particular example, each sensor plate 32 has a width of about 11 mm wide and a length of about 45 mm. The sensor plates 32 may be manufactured of conductive ink deposited onto the bottom surface 41 of a multi-layer printed circuit board 40. The multi-layered printed circuit board 40 may be selected from a material used to manufacture RF printed circuit boards in order to resist dielectric constant variance and dimensional variances associated with temperature variations.

The capacitance to digital conversion process may be accomplished by the AD7147 from Analog Devices. Other controllers that may be used to perform the capacitance to digital conversion include the AD7477 from Analog Devices, the PsoC controller CY8C21534 from Cypress Semiconductor, the C8051CF706 from Silicon Laboratories, or others.

The display circuit 50 functions may be performed using the MM74HC164 shift registers from Fairchild Semiconductor. This display circuit 50 transmits a signal from the controller 60 to the indicators 52, which may comprise LEDs arrayed along the back of the upper housing 13 in two parallel rows, with two opposing indicators on either side of the back of the housing corresponding to each of the nineteen sensor plates 32 for a total of 38 indicators 52. The power controller 20 may comprise the MC33375 integrated circuit from On Semi.

The housing 12 may be manufactured from ABS plastic. In order to accommodate the nineteen sensor plates 32, the housing 12 may have a length of about 10" and a width of about 3". A handle 15 running along the longitudinal axis of the upper housing 13 can be designed to be easy to hold while keeping the user's hand about 1" away from the surface of the PCB 40 and at the same time not obscuring the user's line of sight to the rows of indicators 52 positioned on the back side of the upper housing 13. In other embodiments, the user's hand may be less than 1" away from the surface of the PCB 40.

In some embodiments, the housing 12 has a longitudinal axis with a length of at least about 6", which advantageously enables the obscured feature detector 10 to span the full width of a common obscured feature 82, such as a stud, from a stationary position. By contrast, many existing stud detectors are not wide enough to span the full width of a stud without being moved.

In other embodiments, the obscured feature detector 10 may be longer than 16", with about thirty sensor plates 32. Such a configuration may be particularly advantageous, because many structures built according to standard construction methods in the United States have studs spaced 16" apart on center. Thus, whenever an obscured feature detector 10 having a length greater than about 16" is placed against a wall of such a structure, the detector 10 will typically indicate the presence of at least one stud on the first try.

In some embodiments, the obscured feature detector 10 can be operated in different modes. For example, the user may select a first mode suitable for detecting materials with a dielectric constant between about 2 and 6 corresponding to non-conductive construction materials such as wood, or a second mode suitable for detecting conductive construction materials such as metal studs.

In some embodiments, the obscured feature detector 10 has an alternate operating mode that can be selected to search only for the region with the highest capacitance. An algorithm that always displays the highest reading independent of the signal strength may be able to find hidden objects that would be considered noise level in normal mode.

In some embodiments, the obscured feature detector 10 has a flexible printed circuit board 40 that allows the printed circuit board 40 to bend to match the contour of the surface 80 to be detected. In these embodiments, one or more printed circuit boards 40 are flexibly connected to the housing 12 using a medium such as foam rubber, springs, gel, hinges, pivot points, an encapsulated gas such as air, a housing body having flexible features, or other suitable compressible or flexible media.

In some embodiments, the obscured feature detector 10 uses a plurality of printed circuit boards 40 that may each be flexibly connected to the detector housing 12.

In some embodiments, the housing 12 has flexible features that allow the housing 12 to flex or bend to adapt to the contour of a non-flat detecting surface. In one particular example, an obscured feature detector 10 uses two printed circuit boards 40. Each printed circuit board 40 is attached to the housing 12. In this particular example, the housing 12 is able to flex in the center, such that each sensor plate 32 more closely matches the contour of the surface 80 to be detected. In some embodiments, the housing 12 is mostly or entirely flexible.

In some embodiments, an auto-calibration adjustment mode is provided. The auto-calibration adjustment mode records and stores the capacitive readings from each of the regions. It compares the readings from substantially adjacent regions and determines if one particular sensor plate 32, or region, tends to have higher or lower readings than its adjacent sensor plate(s) 32 or region(s). When a pattern is detected that one particular sensor plate 32 or one particular region consistently has substantially higher or lower readings than adjacent sensor plates 32 or regions, then adjustments are made to the calibration table to remove the abnormality.

In some embodiments, the obscured feature detector 10 can be operated in a first mode suitable for detecting obscured features 82 through a thin surface that may correspond to a thin piece of sheet rock, or a second mode suitable for detecting obscured features 82 through a thick surface that may correspond to a thick piece of sheetrock.

In some embodiments, the obscured feature detector 10 can be operated in a first mode suitable for detecting obscured features 82 behind a first surface material with a comparatively higher dielectric constant such as a OSB or plywood, or a second mode suitable for detecting obscured features 82 behind another surface material with a lower dielectric constant such as gypsum sheetrock.

In some embodiments, the obscured feature detector 10 can be operated in a first mode suitable for detecting an obscured feature 82 that is embedded within a material, such as detecting a pipe within concrete, or a second mode suitable for detecting when the obscured feature 82 is located on the other side of a surface 80, such as detecting a stud on the other side of a piece of sheetrock.

Although the present disclosure is described in terms of certain preferred embodiments, other embodiments will be apparent to those of ordinary skill in the art, given the benefit of this disclosure, including embodiments that do not provide all of the benefits and features set forth herein, which are also within the scope of this disclosure. It is to be understood that other embodiments may be utilized, without departing from the spirit and scope of the present disclosure.

What is claimed is:

1. An obscured feature detector comprising:
a plurality of sensor plates, each having a capacitance that varies based on: (a) the proximity of the sensor plate to one or more surrounding objects, and (b) the dielectric constant(s) of the surrounding object(s);
a sensing circuit coupled to the sensor plates, the circuit being configured to measure the capacitances of the sensor plates;
a controller coupled to the sensing circuit, the controller being configured to analyze the capacitances measured by the sensing circuit to identify sensor plates located in one or more regions of relative high capacitance, as well as sensor plates located in one or more regions of relative low capacitance; and
a plurality of indicators coupled to the controller, each indicator capable of toggling between a deactivated state and an activated state,
wherein the controller is configured to activate one or more of the indicators to identify the location of region(s) of relative high capacitance.

2. The obscured feature detector of claim 1, comprising at least four sensor plates.

3. The obscured feature detector of claim 1, further comprising a housing having a longitudinal axis with a length of at least about 6".

4. A stationary obscured feature detector comprising:
a housing having a top, a bottom, and an interior cavity, with a handle located near the top, the housing being configured to be placed against a surface at a first location to detect the presence of one or more features obscured by the surface near the first location, without requiring movement of the stationary obscured feature detector;
a plurality of sensor plates arrayed substantially in a plane near the bottom of the housing, each sensor plate having a capacitance that varies based on: (a) the proximity of the sensor plate to one or more surrounding objects, and (b) the dielectric constant(s) of the surrounding object(s);
a sensing circuit located in the interior cavity of the housing and coupled to the sensor plates, the sensing circuit being configured to transmit charge to the sensor plates and read the capacitances of the sensor plates;
a controller located in the interior cavity of the housing and coupled to the sensing circuit, the controller being configured to analyze the capacitances measured by the sensing circuit; and
a plurality of indicators located near the top of the housing and coupled to the controller,
wherein the controller is configured to control the indicators to identify the location of the feature(s) obscured by the surface near the first location.

5. The obscured feature detector of claim 4 wherein the indicators are arrayed in a line along a longitudinal axis of the housing at intervals corresponding to the spacing of the sensor plates, with every indicator corresponding to a unique sensor plate so that the indicator changes state when the corresponding sensor plate detects a capacitance value that exceeds a threshold value.

6. The obscured feature detector of claim 4 wherein the indicators are arrayed in more than one line along a longitudinal axis of the housing at intervals corresponding to the spacing of the sensor plates, with a plurality of indicators at the same longitudinal location corresponding to a unique sensor plate so that the indicators indicate when the corresponding sensor plate detects a capacitance value that exceeds a threshold value.

7. The obscured feature detector of claim 4 wherein the indicators are arrayed in a line along a longitudinal axis of the housing and there are more indicators than sensor plates.

8. The obscured feature detector of claim 4 wherein the indicators are arrayed in a line along a longitudinal axis of the housing and there are fewer indicators than sensor plates.

9. The obscured feature detector of claim 4, further comprising a dedicated sensing circuit for each sensor plate.

10. The obscured feature detector of claim 4, wherein the obscured feature is an electrical insulator.

11. The obscured feature detector of claim 4, wherein the obscured feature is an electrical conductor.

12. The obscured feature detector of claim 4, wherein the obscured feature detector has a length of at least about 16".

13. The obscured feature detector of claim 4, wherein the indicators are individual elements in an LCD display.

14. A method of detecting an obscured feature behind a surface, comprising:
placing an obscured feature detector in a stationary position on the surface, the obscured feature detector having a plurality of sensor plates arranged in an array;
measuring, via a sensing circuit, capacitance readings sensed by the sensor plates in a plurality of regions, each region corresponding to an area surrounding one or more of the sensor plates;
comparing the sensed capacitance readings in different regions using a controller coupled to the sensing circuit;
identifying, via the controller, one or more regions of relative high capacitance based on the compared capacitance readings; and
activating, via the controller, one or more indicators corresponding to the location of the region(s) of relative high capacitance.

15. The method of claim 14, further comprising performing additional capacitance readings on sensor plates adjacent to a region of relative high capacitance.

16. The method of claim 14, further comprising determining a baseline of the obscured feature detector by:
placing the obscured feature detector on the surface in an area where no obscured features are believed to be present;
sorting, via the controller, the capacitance readings of all sensor plates from lowest to highest; and
designating, via the controller, the value of the third lowest capacitance reading to represent a surface with no feature behind it.

17. The method of claim 14, wherein the measuring step comprises:
iteratively placing a charge on a sensor plate via the sensing circuit, and sharing the charge with a capacitor connected to the sensor plate through a resistor, until the voltage on the capacitor reaches a reference voltage;
counting the number of iterations required to achieve the reference voltage; and
equating the number of iterations to a relative capacitance.

18. The method of claim 14, further comprising electrically connecting a plurality of sensor plates to a capacitance to digital converter, and providing to the controller a single capacitance reading representing the plurality of sensor plates.

* * * * *